United States Patent [19]

Causse et al.

[11] Patent Number: 4,990,816

[45] Date of Patent: Feb. 5, 1991

[54] PIEZOELECTRIC CAPSULE WITH RESILIENT CONDUCTING HOLDING MEANS

[75] Inventors: Pierre Causse, Dole; Peter Graham, Bonneville; Bernard Maury, Bonneville; Jean-Claude Walter, Bonneville, all of France

[73] Assignee: Horlogerie Photographique Francaise, Bonneville, France

[21] Appl. No.: 483,922

[22] Filed: Feb. 23, 1990

[30] Foreign Application Priority Data

Feb. 27, 1989 [FR] France ................................ 89 02930

[51] Int. Cl.[5] .............................................. H01L 41/08

[52] U.S. Cl. ...................................... 310/324; 381/190

[58] Field of Search ............... 310/324, 348, 321, 322, 310/354–356; 381/190

[56] References Cited

U.S. PATENT DOCUMENTS

| | | | |
|---|---|---|---|
| 4,295,009 | 10/1981 | Weidler | 179/110 |
| 4,420,706 | 12/1983 | Siebold et al. | 310/324 |
| 4,429,247 | 1/1984 | Feldman | 310/324 X |
| 4,604,606 | 8/1986 | Sweany | 310/324 X |
| 4,626,729 | 12/1986 | Lewiner et al. | 310/324 |

FOREIGN PATENT DOCUMENTS

| | | |
|---|---|---|
| 2126556 | 12/1971 | Fed. Rep. of Germany . |
| 2128399 | 4/1984 | United Kingdom . |

OTHER PUBLICATIONS

Patent Abstracts of Japan, vol. 10, No. 46, (E-383), [2103], 2/22/86.

Patent Abstracts of Japan, vol. 10, No. 184, (E-415), [2240], 6/27/86.

*Primary Examiner*—Mark O. Budd

*Attorney, Agent, or Firm*—Ratner & Prestia

[57] ABSTRACT

A piezoelectric capsule with resilient conducting holding means is disclosed, comprising a hollow metal lid (8) fitted on a base body (7) formed of a printed circuit, and a piezoelectric membrane (1) applied against a front step (17) of the lid (8). A resilient electrically conducting element (22), fixed to the base body (7), bears on the metallized external rear face (5) of the piezoelectric ceramic layer (3) of the membrane (1). The resilient element (22) provides simultaneously electric conduction and mechanical holding of the membrane (1) in position.

12 Claims, 4 Drawing Sheets

PIEZOELECTRIC CAPSULE WITH RESILIENT CONDUCTING HOLDING MEANS

BACKGROUND OF THE INVENTION

1. Field of the Invention

The present invention relates to electroacoustic transducers whose vibrating element is formed of a piezoelectric material layer membrane having electrodes and being held at its periphery in a capsule case.

2. Description of the Prior Art

This type of capsule has been known for many years and is described for example in the documents GB-A-No. 2 046 554, JP-A-No. 58 202699, JP-A-No. 60 199298 or JP-A-No. 61 29298.

In these known capsules, the membrane is formed of a thin disk to which is fixed a piezoelectric ceramic layer covering the central zone of the disk, the two faces of the piezoelectric ceramic layer being metallized so as to form respectively an internal electrode applied against the thin disk and an external electrode. The membrane is housed in a case formed of a base body and a lid fitting one on the other along a closed generally circular periphery. The base body forms a first wall substantially parallel to the disk and defining with the disk a rear acoustic cavity. The lid forms a second wall substantially parallel to the disk and defining with the disk a front acoustic cavity. The case comprises a supporting surface, for example in the form of an inner peripheral step, against which the periphery of the disk is held applied by holding means. Electric connection means provide the respective electric connections of one and other of the electrodes, with a first and second external connection terminal of the case.

In known capsules, mechanical holding of the membrane in position with respect to the case and the electric connection of the electrodes and of the connection terminals are provided by separate means.

Thus, in the document GB-A-No. 2 046 554, the periphery of the disk bears on a peripheral supporting surface of the base body, against which it is held by a peripheral O-seal inserted between the lid and the disk; the electric connection is provided by conducting strips fixed to the disk and connecting the respective electrodes to a peripheral zone of the disk projecting from the case.

In the document JP-A-No. 58 202699, the disk is also held against a peripheral supporting surface of the base body, against which it is urged by a peripheral 0-seal inserted between the disk and the lid; the electric connections are provided on one hand by an electric conductor in the form of a wire soldered to an electric connection terminal and to the external electrode, and on the other hand by the disk itself which is made from an electrically conducting material in contact with the case which is also electrically conducting by its periphery.

In the document JP-A-No. 60 199298, the periphery of the disk bears against a peripheral supporting surface of the lid against which it is held by a peripheral annular seal inserted between the base body and the disk; one of the electric connections is provided by a resilient tongue, a first end of which is held against the base body and the other end of which bears on the piezoelectric element of the disk.

In the document JP-A-No. 61 29298, the periphery of the disk is embedded between the peripheries of the lid and the base body; one of the electric connections is provided by a resilient tongue a first end of which is fixed by a rivet to the centre of the base body and the other end of which bears on the piezoelectric element of the disk.

Known capsules are then relatively complex and require the provision of first means for mechanically holding the membrane in the case and second means providing the electric connection of the electrodes, and all these means must be assembled during assembly of the capsule.

The present invention has particularly as object to avoid the drawbacks of known capsules, by attempting to simplify the assembly and reduce the number of parts to be made and assembled, without adversely affecting the acoustic results obtained, and improving if possible these results.

According to another object of the invention, the new capsule structure holds the membrane in the case without using an O-seal; the inventors have in fact discovered that the presence of such O-seals in a capsule has drawbacks during large-scale production; in fact, known seals usable for large scale production are generally of dimensions which are not very regular, which induces defects in the evenness of the surfaces holding the piezoelectric membrane and variations in the acoustic qualities of the capsules thus obtained. The defects related to the presence of O-seals also result from the variation of thickness of the other stacked parts forming the capsule, particularly the base body and the lid, creating a nipping force on the periphery of the disk which is difficult to control. The mechanical holding means of the invention avoid such variations.

According to another object of the invention, the new capsule structure substantially increases the possibilities of deformation of the peripheral zone of the disk, so that the electroacoustic qualities of the capsule are substantially increased.

The invention further provides particular embodiments leading to the general improvement of the electroacoustic qualities of the capsule. In particular, attempts have been made to distribute the natural mechanical vibratory frequencies of the different elements of the capsule, so as to obtain the flattest possible response curve in the usual operating frequency range.

Another effect sought is to obtain a good compromise between the acoustic effect of the capsule and its size, particularly its thickness.

SUMMARY OF THE INVENTION

To attain these objects, as well as others, the capsule of the invention comprises the main elements of known capsules, namely a membrane formed of a thin disk carrying a piezoelectric ceramic layer covering the central zone of the disk, a case formed of a base body and a lid, fixed axially one to the other along a closed periphery, a peripheral step of the case, inside said closed periphery, and against which a first periphery face of the disk is held applied by holding means, a first and second electric connection terminals connected to the electrodes of the piezoelectric membrane by first and second electric connection means, resilient electrically conducting means inserted between the membrane and the case, bearing both against a membrane portion connected electrically to one of the internal or external electrodes, and against a case portion connected electrically to the corresponding electric connection terminal, so that the resilient electrically conducting means participate in the electric connection between said internal or external electrode and the corresponding electric connection terminal; according to the invention:

the second periphery face of the membrane is free, separated from the case by a space free of any seal;

said resilient electrically conducting means resiliently urge the membrane in the direction of the peripheral inner step of the case and hold it against said inner peripheral step, so that they provide simultaneously by themselves, without using an annular seal, the function of holding the first periphery face of the disk against the case step.

With such a structure of the invention, the peripheral force for holding the membrane is made substantially invariable, independent of the dimensional variations of the stacked parts.

According to an advantageous embodiment:

the piezoelectric ceramic layer forms the rear face of the disk, facing the base body, so that the external electrode faces the base body, the front face of the periphery of the disk faces said case step, itself formed in the lid, the resilient electrically conducting means are inserted between the external electrode and the internal face of the base body, bearing both on the external electrode and on a portion of the base body connected electrically to the second electric connection terminal, so as to provide electric connection between the second electric connection terminal and the external electrode, said resilient electrically conducting means urge the membrane resiliently in the direction of the lid and by themselves provide the function of holding the periphery of the disk against the lid step.

The inventors have discovered that it is particularly advantageous, particularly for obtaining the widest and flattest possible frequency response curve of the capsule, to have the resilient electrically conducting means bearing on the external electrode in the zone situated in the vicinity of the nodal circle of the membrane, namely the zone formed by the loci of the nodes of the third circular vibration mode of the membrane, said resilient electrically conducting means bearing on said external electrode at at least two points distant from each other.

In a first embodiment, the resilient electrically conducting means may comprise several electrically conducting elements separate from each other, each one bearing both on the external electrode and on the base body of the case.

In another embodiment, said resilient electrically conducting means may be assembled together in a single element with several arms, comprising a single zone bearing on the base body, the ends of the arms bearing on the external electrode.

Preferably, to each bearing point of the resilient electrically conducting means on the external electrode, there corresponds a resilient connection with different mechanical characteristics, thus presenting different natural vibratory modes.

A good compromise between the acoustic efficiency of the capsule and its size is obtained, according to the invention, by combining a membrane whose natural frequency is about 1 kHz with an acoustic filter comprising a front acoustic cavity and a rear acoustic cavity whose respective heights are about 1 mm, for a diameter of about 30 mm. The heights of about 1 mm allow the membrane to oscillate freely and permit housing of the connection means.

BRIEF DESCRIPTION OF THE DRAWINGS

Other objects, features and advantages of the present invention will be clear from the following description of a particular embodiment, with reference to the accompanying figures, in which.

DESCRIPTION OF THE PREFERRED EMBODIMENTS

Figure 1:
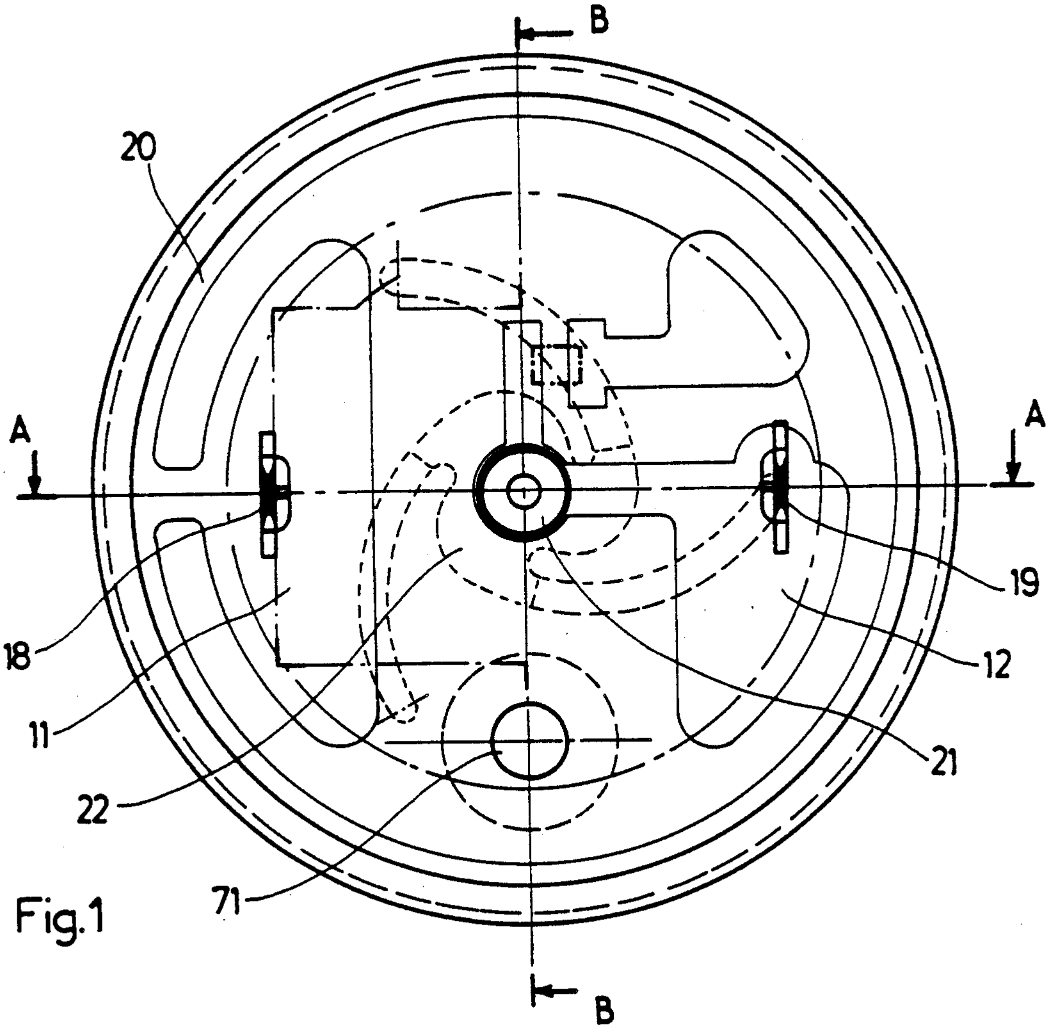
FIG. 1 shows a bottom view of the external surface of the capsule base body according to one embodiment the invention.

As shown in the figures, a piezoelectric capsule according to the invention comprises a membrane 1 formed of a thin disk 2 with circular contour, to which is fixed a piezoelectric ceramic layer 3 covering the central zone of disk 2. In the embodiment shown, disk 2 is made from an electrically conducting material, for example brass, and the piezoelectric ceramic layer 3 has a circular contour which is concentric with respect to disk 2, covering the central zone of the disk and leaving apparent a peripheral border on the face of disk 2, to which it is applied. The piezoelectric ceramic layer is metallized on both faces, its internal face 4 forming an internal electrode and being applied against disk 2, while its external face 5 forms an external electrode and is apparent.

Membrane 1 is housed in a case 6 formed of a base body 7 and a hollow lid 8, fixed axially together along a closed periphery 9, e.g. circular such as shown. The base body 7, in the embodiment shown, is formed of a flat plate of insulating material, for example a material generally used in the printed circuit technique, whose external face 10 carries conducting tracks 11 and 12 shown in FIG. 1. Lid 8 is made from an electrically conducting material, for example aluminium or an aluminium alloy, and comprises a central circular wall 13 joined to a peripheral side wall 14. The peripheral wall 14 comprises a rear step 15, narrowing the internal space of case 6 as shown in FIGS. 3 or 2, against which the periphery of the base body 7 bears. The edge 16 of the peripheral wall 14 is bent inwards so as to bear against the external face 10 of base body 7, and crimp said base body 7 to the lid 8.

The peripheral wall 14 of lid 8 further comprises a front step 17, forming a second narrowing of the inner space of case 6 as shown in FIGS. 2 and 3, and disposed about half way between the central wall 13 and the rear step 15. The first periphery face 110 of membrane 1 is held applied against the front step 17 of lid 8 by resilient means which will be described hereafter. The second periphery face 111 of membrane 1 is free, i.e. separated from base body 7 by a space 112 free of any seal. The piezoelectric ceramic layer 3 is disposed on the base body 7 side, as shown in the figures so that the external electrode 5 faces the base body 7.

Figure 2:
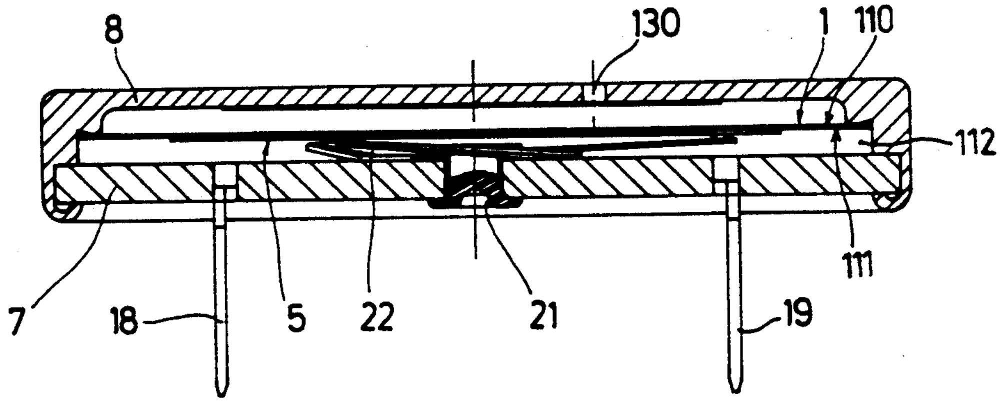
FIG. 2 is a front view of a capsule according to the invention in cross section through the plane A—A of FIG. 1.
Figure 3:
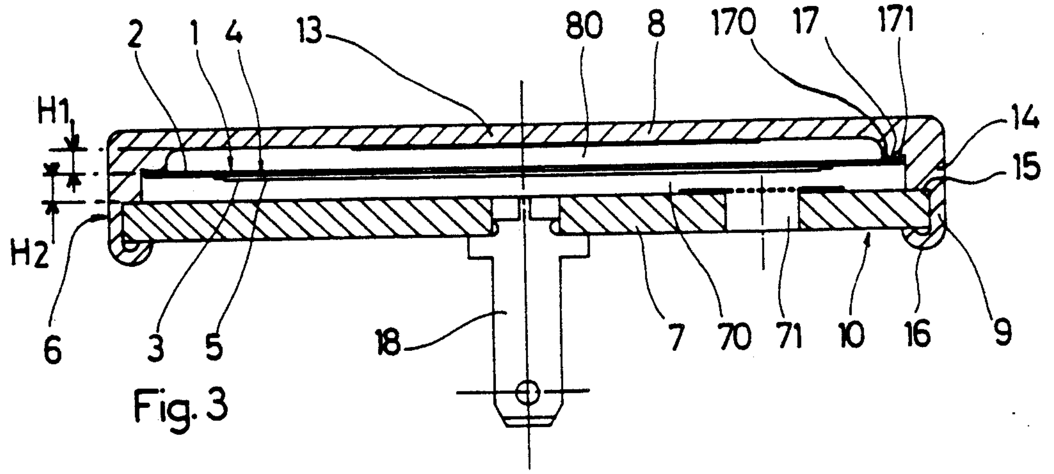
FIG. 3 is a side view of the capsule according to the invention in cross section through the plane B—B of FIG. 1.
Figure 4:
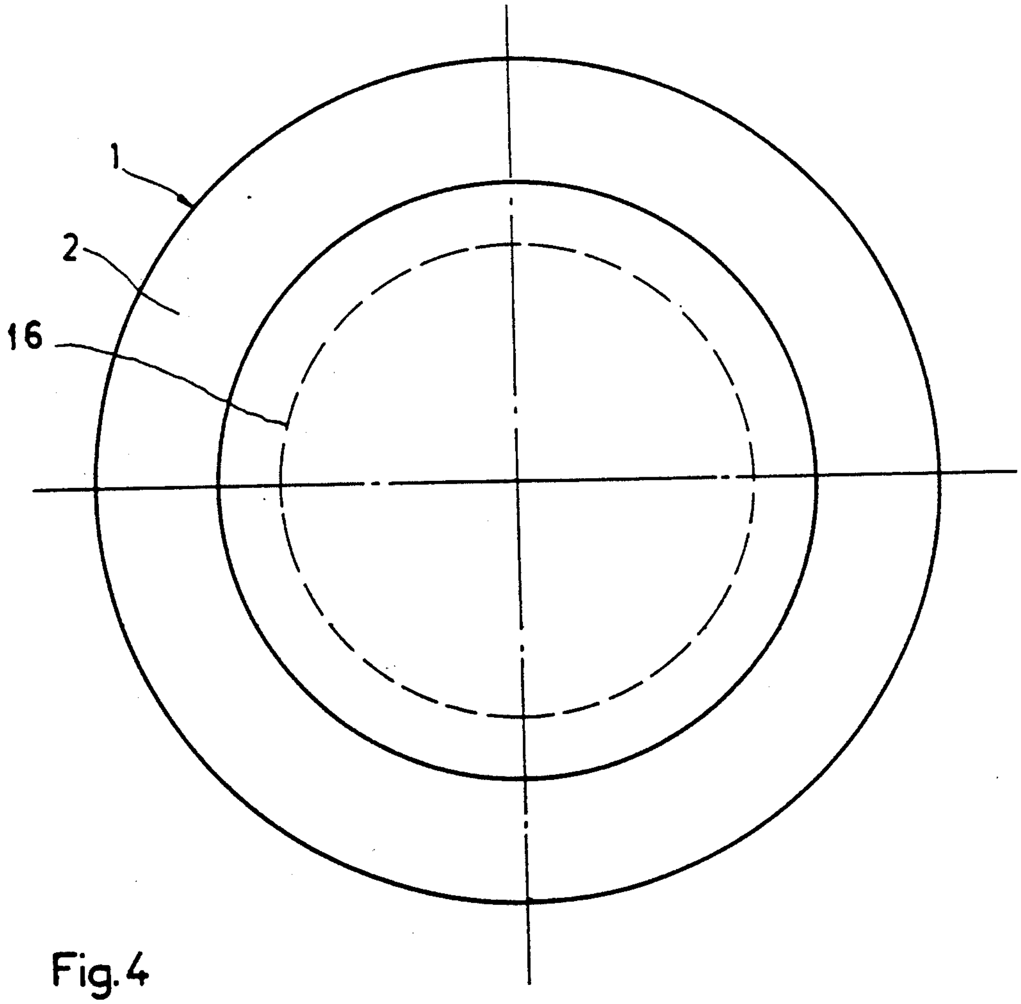
FIG. 4 is a bottom view of a capsule membrane according to the invention.
Figure 5:
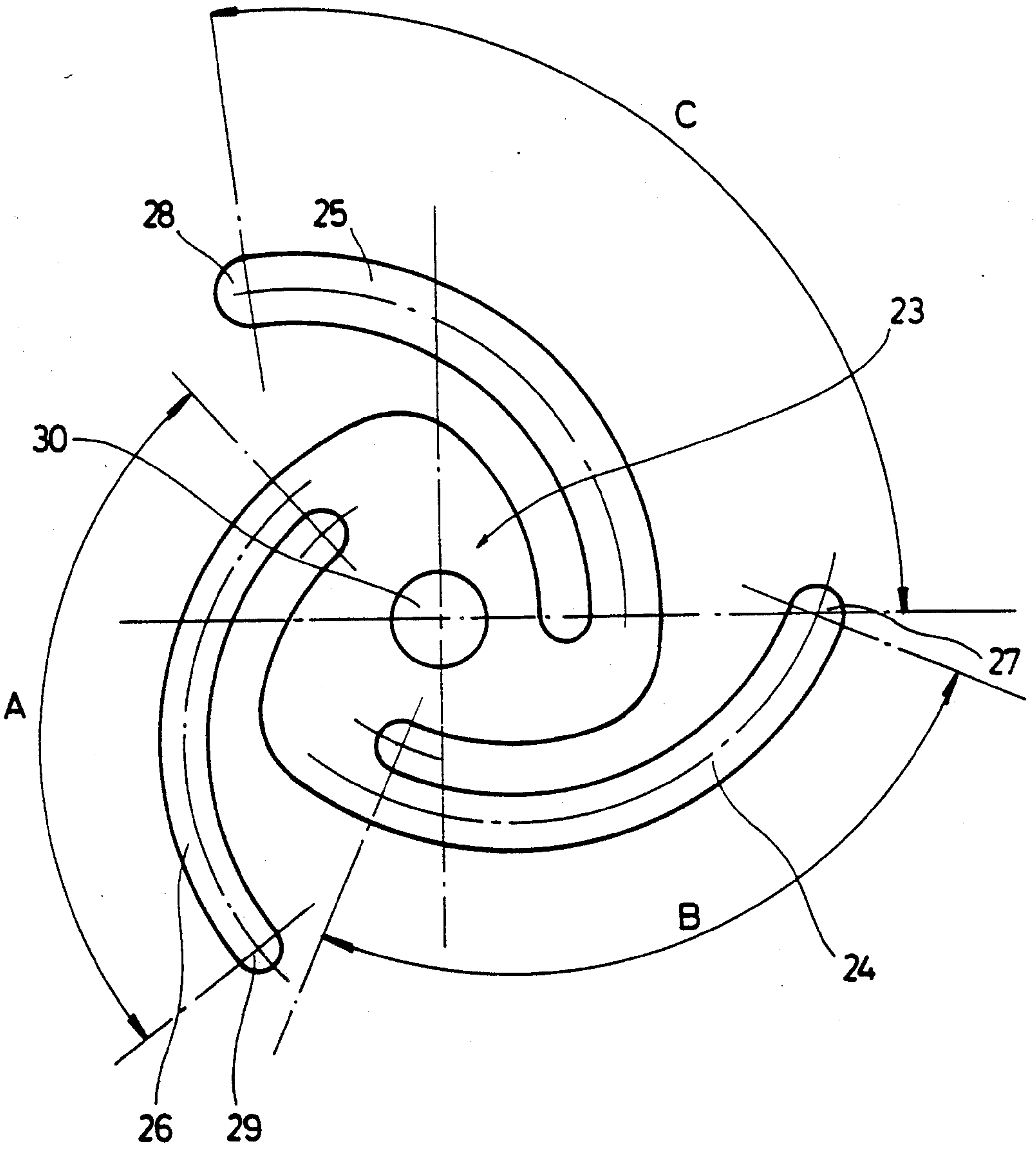
FIG. 5 is a top view of a particular embodiment of the resilient electrically conducting means according to the invention.

When the capsule is assembled, as shown in FIGS. 1 to 3, the base body 7 forms a first wall substantially parallel to disk 2, with which it forms a rear acoustic cavity 70, and the central wall 13 of lid 8 is substantially parallel to disk 2 and forms therewith a front acoustic cavity 80.

In a way known per se, the central wall 13 of lid 8 comprises holes 130 for sound to pass from the front acoustic cavity 80 to the external atmosphere, and the base body 7 comprises a passage 71 with an acoustic filter connecting the rear acoustic cavity 70 with the external atmosphere.

According to the invention, the respective heights H1 and H2 of the front acoustic cavity 80 and the rear acoustic cavity 70 are advantageously equal to about 1 mm, for example between 0.9 and 1.1 mm.

A first electric connection terminal 18 is fitted to the base body 7 and projects from the external face 10 of said base body 7 for electric connection to an external circuit. Similarly, a second electric connection terminal 19 is fitted to base body 7 and projects from the external face 10 of said base body 7 for connection to an external electric circuit. The first electric connection terminal 18 is soldered to the first conducting track 11 of base body 7, said conducting track 11 comprising a peripheral portion 20 in contact with lid 8. Thus, the first electric connection terminal 18 is connected electrically to the internal electrode 4 by the conducting disk 2, the conducting lid 8 and the conducting track 11.

The second electric connection terminal 19 is connected electrically by soldering to the second conducting track 12, itself in contact with a central metal rivet 21. The central metal rivet 21, engaged in a central hole of base body 7, is fast with a resilient electrically conducting means 22 itself in contact with the external electrode 5. Thus, the second electric connection terminal 19 is connected electrically to the external electrode 5 via the conducting track 12, the central rivet 21 and the resilient electrically conducting means 22. Naturally, the conducting tracks 11 and 12 are insulated electrically from each other.

Thus, the resilient electrically conducting means 22 provide the electric connection function between the external electrode 5 and the corresponding electric connection terminal 19. Furthermore, the resilient electrically conducting means 22 by themselves hold the membrane 1 applied against the front step 17 of lid 8. For that, the resilient electrically conducting means 22, fixed to the centre of base body 7 by rivet 21, have a natural resilience and a form such that, when the capsule is assembled as shown in the figures, with membrane 1 inserted between lid 8 and base body 7, and with the resilient electrically conducting means 22 inserted between said membrane 1 and the base body 7, the resilient electrically conducting means urge the membrane 1 resiliently in the direction of lid 8 and hold the first face 110 of its periphery applied against the front step 17.

The overall bearing force exerted by the resilient electrically conducting means 22 on membrane 1 is advantageously between 0.3 Newton and 0.5 Newton, for a membrane whose diameter is equal to about 30 mm.

In the embodiment shown, the front step 17 has, in radial cross section, a trapezium shaped profile whose small base 170 forms a circular ring and provides a bearing surface for disk 2, said small base being separated from the peripheral wall 14 by a peripheral groove 171.

Figure 6:
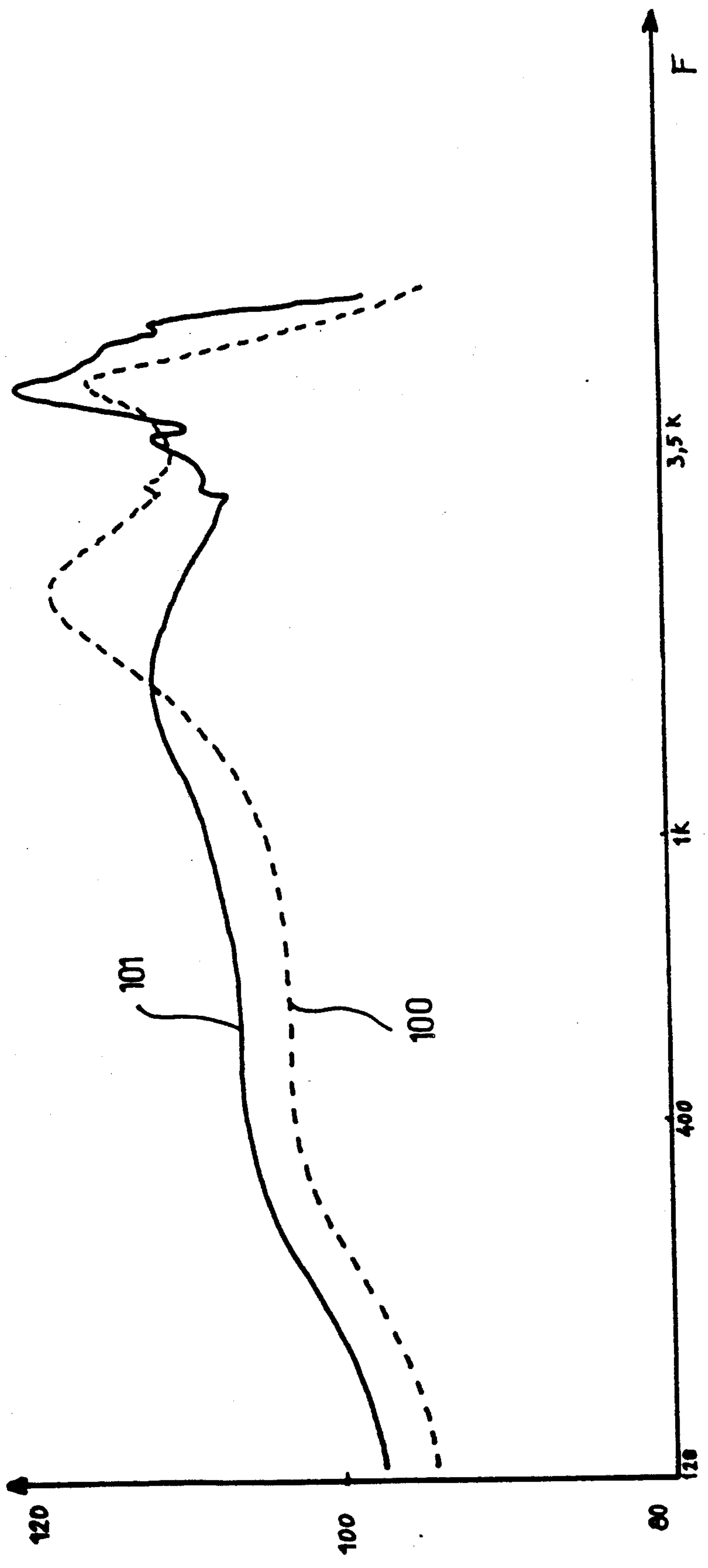
FIG. 6 illustrates the results obtained by a capsule according to the present invention relatively to the frequency response.

This embodiment of the front step 17 with small base 170 and groove 171, associated with holding of the membrane by the resilient electrically conducting means 22, appreciably improves the frequency response curve of the capsule. Thus, FIG. 6 shows two comparative curves of capsules with identical dimensions, curve 100 corresponding to a capsule in which the disk is held in position by an O-seal bearing on a step of the case, curve 101 corresponding to a capsule according to the invention.

In the embodiment shown in the figures, the resilient electrically conducting means 22 are formed by a metal part, made for example from a material sold under the trademark Duriflex, comprising a central portion 23 with a hole for passing the fixing rivet 21 therethrough, and to which are connected three arms 24, 25 and 26. The three arms 24, 25, 26 are each developed substantially in the form of a spiral from the central portion 23. Their respective ends 27, 28 and 29 are equidistant from the center 30 of the central portion 23 or center of the hole through which the fixing rivet 21 passes, and are equidistant from each other, spaced evenly apart at 120° about the center 30. The respective lengths of the three arms are unequal and their widths are also unequal. In the embodiment shown, the first arm 24 is developed at an angle B of about 92°, whereas the second arm 25 is developed at an angle C of about 120°, and the third arm 26 is developed at an angle A of about 86°. The respective widths of the arms are chosen as a function of the respective lengths so that the bearing forces exerted by each of the ends 27, 28 and 29 of the arms against the external electrode 5 are substantially equal. Under these conditions, each of the arms has a natural vibratory characteristic different from that of each of the other two arms.

The distance between center 30 and each of the ends 27, 28 and 29 of the arms is chosen substantially equal to the radius of the nodal circle of membrane 1. By nodal circle is meant the loci of the vibration nodes of the third circular vibration mode of membrane 1. This nodal circle may be defined empirically, by causing a membrane to vibrate in the third vibration mode, and locating the position of the vibration nodes forming the nodal circle. The vibration nodes may be detected by any means known in the technique, for example by observing the movement of a powder sprinkled on the surface of a membrane which is caused to vibrate.

Part 22 may be formed by stamping and shaping a plate of suitable thickness made from a resilient and electrically conducting material.

Alternately, two or three separate parts may be used, one end of which is fixed to the base body 7 and the other end of which bears on an appropriate zone of the external electrode 5.

The present invention is not limited to the embodiments which have been explicitly described, but includes the different variants and generalizations thereof contained within the scope of the following claims. In particular, the resilient electrically conducting means may be formed by a resilient washer inserted axially between the conducting periphery of disk 2 and a conducting annular bearing surface of the case. The resilient electrically conducting means then provide the electric connection of the internal electrode 4 via the conducting disk 2.

We claim:

1. An electroacoustic capsule with piezoelectric membrane, in which:

the membrane is formed of a thin disk on which is fixed a piezoelectric ceramic layer covering the central zone of the disk and the two faces of which are metallized and form respectively an internal electrode and an external electrode, the membrane is housed in a case formed of a base body and a lid, fixed axially one to the other along a closed periphery, the base body comprising a first wall substantially parallel to the disk with which it forms a rear acoustic cavity, the lid comprising a second wall substantially parallel to the disk with which it forms a front acoustic cavity, the case comprises a peripheral step inside said closed periphery, against which step a first periphery face of the membrane is held applied by holding means, a first and second electric connection terminals are insulated electrically and mounted on the base body the first electric connection terminal is connected electrically to the internal electrode by first electric connection means, the second electric connection terminal is connected electrically to the external electrode by second electric connection means, resilient electrically conducting means are inserted between the membrane and the case, bearing both against a portion of the membrane connected electrically to one of the internal or external electrodes, and against a portion of the case connected electrically to the corresponding electric connection terminal, so that the resilient electrically conducting means participate in the electric connection between said internal or external electrode and the corresponding electric connection terminal; wherein said second periphery face of the membrane is free, separated from the case by a space free of any seal;

said resilient electrically conducting means resiliently urge the membrane in the direction of the peripheral inner step of the case and hold it against said inner peripheral step so that they provide simultaneously by themselves, without using an annular seal, the function of holding the first periphery face of the membrane against the step of the case.

2. The electroacoustic capsule as claimed in claim 1, wherein:

said piezoelectric ceramic layer forms the rear face of the disk, facing the base body so that the external electrode faces the base body said front face of the periphery of the disk faces said case step itself formed in the lid, said resilient electrically conducting means are inserted between the external electrode and the internal face of the base body bearing both on the external electrode and on a portion of the base body connected electrically to the second electric connection terminal, so as to provide electric connection between the second electric connection terminal and the external electrode, said resilient electrically conducting means urge the membrane resiliently in the direction of the lid and by themselves provide the function of holding means by holding the periphery of the membrane applied against the lid step.

3. The electroacoustic capsule as claimed in claim 2, wherein said resilient electrically conducting means bear on the external electrode in the vicinity of the nodal circle of the membrane, at at least two contact points distant one from the other.

4. The electroacoustic capsule as claimed in claim 3, wherein to each bearing point of said resilient electrically conducting means on the external electrode there corresponds a resilient connection having different mechanical characteristics, presenting different natural vibratory modes.

5. The electroacoustic capsule as claimed in claim 3, wherein said resilient electrically conducting means comprise several separate resilient elements, each of the elements being fixed to the base body and bearing on the external electrode.

6. The electroacoustic capsule as claimed in claim 3, wherein said resilient electrically conducting means comprise a single element with several arms, a central portion of the single element being fixed to the base body, the ends of the arms bearing on the external electrode.

7. The electroacoustic capsule as claimed in claim 6, wherein said arms have widths and lengths which are different with respect to each other, while producing substantially equal bearing forces on the external electrode.

8. The electroacoustic capsule as claimed in claim 7, wherein said single element forming a resilient electrically conducting means comprises three arms whose bearing points on the external electrode are spaced apart at 120° about the center of said electrode, the bearing forces being equal.

9. The electroacoustic capsule as claimed in claim 8, wherein said single element forming said resilient electrically conducting means is fixed to the centre of the base body.

10. The electroacoustic capsule as claimed in claim 9, wherein the arms of said single element forming the resilient electrically conducting means each have a spiral shape.

11. The electroacoustic capsule as claimed in claim 1, wherein the bearing force exerted by said resilient electrically conducting means on the membrane is between 0.3 Newton and 0.5 Newton.

12. The electroacoustic capsule as claimed in claim 1, wherein the respective heights (H1, H2) of the front acoustic cavity and the rear acoustic cavity of the capsule are equal to about 1 mm.

* * * * *